United States Patent

Fagg

(10) Patent No.: US 9,438,171 B2
(45) Date of Patent: Sep. 6, 2016

(54) MULTIPLYING CURRENT CONVEYOR FOR AMPLIFIER

(71) Applicant: SNAPTRACK, INC., San Diego, CA (US)

(72) Inventor: Russell Fagg, Cambridge (GB)

(73) Assignee: SNAPTRACK, INC., San Diego, CA (US)

( * ) Notice: Subject to any disclaimer, the term of this patent is extended or adjusted under 35 U.S.C. 154(b) by 0 days.

(21) Appl. No.: 14/603,686

(22) Filed: Jan. 23, 2015

(65) Prior Publication Data

US 2015/0214898 A1 Jul. 30, 2015

(30) Foreign Application Priority Data

Jan. 24, 2014 (GB) .................................. 1401215.7

(51) Int. Cl.

| H03F 1/02 | (2006.01) |
|---|---|
| H03F 3/45 | (2006.01) |
| H03F 3/193 | (2006.01) |
| H03F 3/24 | (2006.01) |
| H03F 3/345 | (2006.01) |

(52) U.S. Cl.
CPC ............ *H03F 1/0222* (2013.01); *H03F 3/193* (2013.01); *H03F 3/24* (2013.01); *H03F 3/345* (2013.01); *H03F 2200/456* (2013.01); *H03F 2200/91* (2013.01)

(58) Field of Classification Search
USPC ....... 330/288, 252–261, 277, 295, 124 R, 84
See application file for complete search history.

(56) References Cited

U.S. PATENT DOCUMENTS

| 4,060,770 | A | 11/1977 | Schade, Jr. |
|---|---|---|---|
| 6,624,704 | B1 | 9/2003 | Varadarajan et al. |
| 6,657,489 | B1 | 12/2003 | Ziazadeh et al. |
| 7,193,456 | B1 | 3/2007 | Aude |
| 7,764,115 | B1 | 7/2010 | Fish |
| 8,786,266 | B2 * | 7/2014 | Deval .................. H02M 3/158 323/282 |

OTHER PUBLICATIONS

"Parent UK Patent Application No. GB 1401215.7", "GB Search Report", Jul. 18, 2014, Publisher: UK IPO, Published in: GB.

* cited by examiner

*Primary Examiner* — Hieu Nguyen

(57) ABSTRACT

A circuit having a first transistor being a common gate connected transistor and a second transistor, the second transistor being M times the size of the first transistor, the first and second transistors having commonly connected gates and commonly connected drains, wherein an apparatus is provided to regulate the source voltage of the second transistor to track the source voltage of the first transistor, wherein the current gain of the circuit is M+1.

19 Claims, 4 Drawing Sheets

Proposed multiplying current conveyor

Reference section    Multiplier section

MULTIPLYING CURRENT CONVEYOR FOR AMPLIFIER

CROSS-REFERENCE TO RELATED APPLICATION

Great Britain Patent Application No. 1401215.7, with a filing date of Jan. 24, 2014, is incorporated herein by reference in its entirety.

FIELD OF THE INVENTION

The present invention relates to a current conveyor for providing a conduit for a signal current from a current source to a load. Such a current conveyor may be advantageously utilised in an amplification stage of an envelope tracking power amplifier system.

BACKGROUND OF THE INVENTION

Envelope tracking power amplifier systems are known in the art, and generally comprise the provision of an input signal to be amplified on an RF input path to a signal input of a power amplifier, and an envelope path for generating a modulated power supply based on the envelope of the input signal, with the modulated power supply being provided to a power supply input of the power amplifier.

In applications envelope tracking power amplifier systems are desired to be highly efficient. In order to be highly efficient, the amplifier component of such systems is required to be highly efficient. In particular efficient, low noise, high bandwidth amplifiers are required by envelope tracking systems.

A current conveyor acts as a conduit for current from one node to another, converting one voltage level to another voltage level, and acting as a buffer. The current conveyor buffers a given current between two nodes at a different voltage.

Current conveyors are used in high frequency applications where a conventional operational amplifier cannot be used because the conventional design is limited by gain-bandwidth products.

Current conveyors are an important component of high-efficiency amplifiers. A current conveyor is required in an amplifier to provide high gain across very high bandwidths, which may be needed to minimise the impact of the noise and spurious signals generated by switch mode circuits used elsewhere in the envelope tracking modulator.

FIG. 1 illustrates an ideal current conveyor. As illustrated in FIG. 1, an input signal is provided on a line 102 to one terminal of a voltage source 104, the other terminal of which is connected to electrical ground. A current source 106 has one terminal connected to electrical ground, and the other terminal generates a signal on line 108. The signal on line 102 is the input signal, and the signal on line 108 is the output signal. Current is detected in voltage source 104 and replicated in current source 106, so that the voltage at the output can be different to the voltage at the input.

A current conveyor circuit should ideally have a zero input impedance to prevent loss in the input circuit. A current conveyor should also ideally have an infinite output impedance to prevent loss in the output circuit.

Whilst FIG. 1 illustrates an ideal implementation of a current conveyor, with reference to FIG. 2 there is illustrated a typical implementation of a current conveyor.

As is illustrated in FIG. 2, a CMOS transistor 202 has a source terminal connected to electrical ground, and a drain terminal connected to one terminal of a current source 208. A CMOS transistor 204 has a source connected to one terminal of a constant current source 206, the other terminal of the current source being connected to electrical ground. The drain terminal of the CMOS transistor 204 is connected to one terminal of a current source 210 which provides a high impedance. The other terminals of the current sources 208 and 210 are connected to a supply voltage $V_S$. The gate of the CMOS transistor 204 is connected to the drain of the transistor 202. The gate of the CMOS transistor 202 is connected to an input signal on line 212. The input signal on line 212 is also connected to the source of the CMOS transistor 204. An output signal is provided on a line 214 which is connected to the drain of the CMOS transistor 204.

A typical current conveyor as illustrated in FIG. 2 has unity gain.

The typical current conveyor as illustrated in FIG. 2 uses a CMOS common gate transistor 204 with a regulated gate voltage provided by CMOS transistor 202 to achieve a low input impedance and a high output impedance.

As transistor 202 switches on, the voltage at the gate of transistor 204 decreases and the voltage at the source of transistor 204 also decreases, counteracting the input voltage increase, and lowering the input impedance. The input approximates a voltage source as indicated in FIG. 1.

With the current conveyor arrangement of FIG. 2, the optimal performance is achieved when the input current and the output current of the current conveyor are equal and thus the current gain is unity. An input impedance of greater than zero, or an output impedance of less than infinity, will reduce the current conveyor's gain to less than unity.

In an amplifier where high gain across a wide bandwidth is advantageous, the usefulness of the unity gain current conveyor is limited. The unity gain provided by such typical current conveyor arrangements is a significant disadvantage in amplifier designs where high gain across a wide bandwidth is required. In existing systems, in order to provide high gain, the current conveyor's limited gain has to be compensated for by increasing the gain requirements of the amplifier sections that precede and follow the current conveyor, in order to achieve a required amplifier gain. These amplifier sections then require an excessive current to provide this gain across a wide bandwidth, and increasing complexity and die area, and reducing efficiency.

It is an aim of the present invention to provide an improved current conveyor for an amplifier.

SUMMARY OF THE INVENTION

In accordance with the invention there is provided a circuit having a first transistor being a common gate connected transistor and a second transistor, the second transistor being M times the size of the first transistor, the first and second transistors having commonly connected gates and commonly connected drains, wherein an apparatus is provided to regulate the source voltage of the second transistor to track the source voltage of the first transistor, wherein the current gain of the circuit is M+1.

The apparatus may comprise a differential amplifier provided to receive the source voltages of the first and second transistors and regulate the source voltage of the second common gate transistor. The output of the differential amplifier may control a transistor which provides the source voltage of the second transistor.

The drain of the first transistor may provide the output of the current conveyor. The drain of the first transistor may be connected to one terminal of a current source. The other terminal of the current source may be connected to a supply voltage. The current source may provide a biasing current for the current conveyor of $I_{CC}$. The current source may provide a bias current of $I_{CC}*M/(1+M)$ to the second transistor. The current source may provide a bias current of $I_{CC}/(1+M)$ to the first transistor.

The source of the first transistor may be connected to receive an input to the current conveyor. The circuit may further comprise a third transistor having a gate connected to receive the input to the current conveyor, and for controlling the gate of the first transistor. The drain of the third transistor may be connected to the gate of the first transistor. The drain of the third transistor may be connected to one terminal of a current source. The other terminal of the current source may be connected to a supply voltage. The source of the third transistor may be connected to electrical ground.

The circuit may be termed a current controlled source. The circuit may be termed a current conveyor.

BRIEF DESCRIPTION OF THE FIGURES

The present invention is now described by way of example with reference to the Figures, in which.

DETAILED DESCRIPTION

The present invention is now described by way of reference to preferred examples and preferred implementations. However one skilled in the art will appreciate that the present invention is not limited to its application to the specific examples as set out herein below.

The present invention is described herein by way of a circuit termed a current conveyor. However in general there is provided a circuit, which may be termed a controlled current source or may be termed a current conveyor. The term current conveyor is a term which is used in the art to describe a circuit having the functionality of current conveying as described herein, and may be also referred to as a controlled current source.

Figure 3:
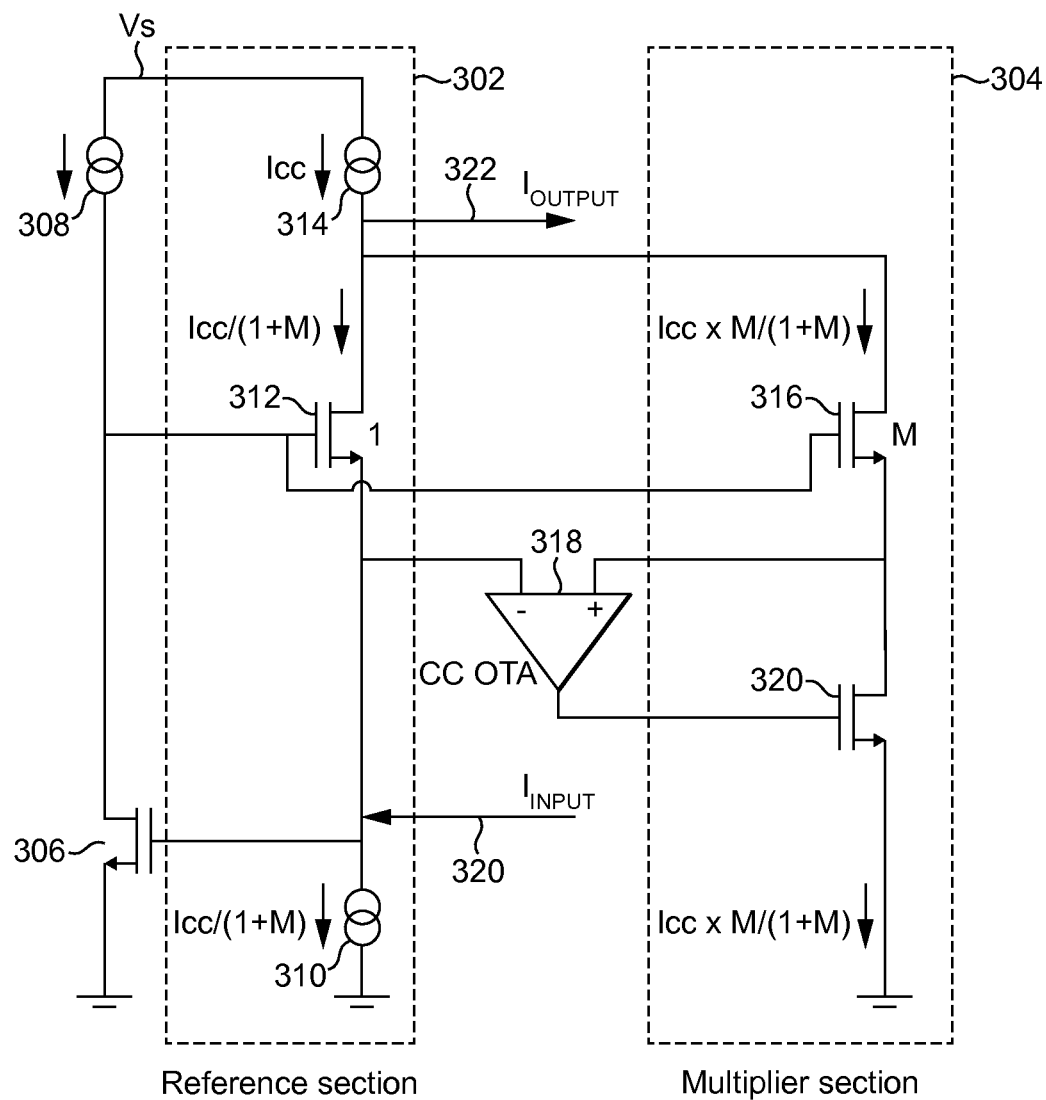
FIG. 3 illustrates an improved current conveyor.

With reference to FIG. 3, there is illustrated a multiplying current conveyor in accordance with a preferred implementation.

The multiplying current conveyor includes a reference section 302 and a multiplier section 304.

The multiplying current conveyor comprises a CMOS transistor 306 having its source connected to electrical ground and its drain connected to one terminal of a current source 308.

A current source 310 of the reference section 302 has one terminal connected to electrical ground and another terminal connected to a source of a CMOS transistor 312 of the reference section 302. The drain of the CMOS transistor 312 is connected to one terminal of a current source 314 of the reference section 302. The current sources 308 and 314 have second terminals connected to a supply voltage $V_S$.

The gate of the CMOS transistor 312 of the reference section 302 is connected to the drain of the transistor 306. The gate of the CMOS transistor 306 is connected to the first terminal of the current source 310 of the reference section.

Figure 1:
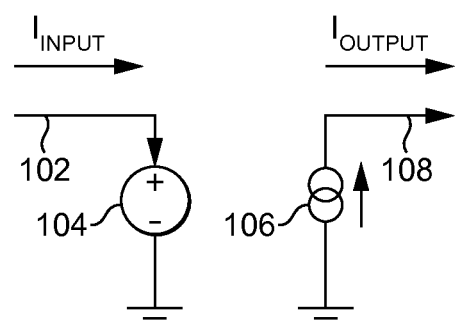
FIG. 1 illustrates an ideal current conveyor.
Figure 2:
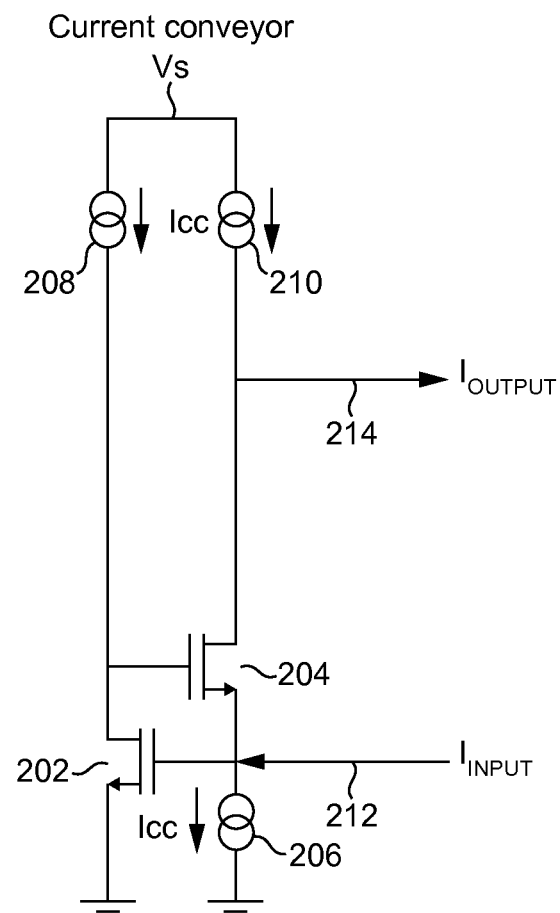
FIG. 2 illustrates a typical implementation of a current conveyor.

The CMOS transistor 306, the current source 308, and the elements of the reference section 302 (the current source 314, the CMOS transistor 312, and the current source 310) form a unity gain current conveyor according to FIG. 2.

An output signal is generated on line 322 at the drain of the CMOS transistor 312. An input signal on line 320 is received at the source of the CMOS transistor 312.

The gate of the CMOS transistor 312 of the reference section 302 is additionally connected to the gate of a CMOS transistor 316 of the multiplier section 304.

The CMOS transistor 316 of the multiplier section 304 has its drain connected to the drain of the CMOS transistor 312 of the reference section 302. The CMOS transistor 316 has its source connected to the drain of a CMOS transistor 320. The source of the CMOS transistor 320 is connected to electrical ground.

The source of the CMOS transistor 312 provides an inverting input to a difference amplifier 318.

The gate of the CMOS transistor 320 is connected to an output of the difference amplifier 318. The difference amplifier 318 has its non-inverting input connected to the source of the CMOS transistor 316.

The multiplying current conveyor of FIG. 3 implements a current gain of (1+M): a gain of unity provided by the reference section 302 plus a gain of M provided by the multiplier section 304.

The current source 314 is biased with a bias current of $I_{CC}$.

The ratio of the current flowing in the drains of the respective transistors 312 and 316 is determined by the physical size of the transistors 312 and 316. The size of transistor 316 is a multiple of the size of transistor 312. Because the transistor 316 is M times the size of transistor 312, it has M times the gain.

The reference section 302 implements a current gain of unity. The reference section 302 uses the conventional current conveyor topology of FIG. 2. The reference section accepts a signal current $I_S$ on line 320. The reference section 302 is biased with a current of $I_{CC}/(1+M)$.

The multiplying section 304 is biased with a current of $I_{CC}*M/(1+M)$, and implements a current gain of M. The relative size of the multiplying section 304 in comparison to the reference section 302 (which includes the common gate transistor) is equal to the desired multiplication factor M.

The source voltage of the common gate transistor 316 of the multiplying section 304 is made identical to the source voltage of the common gate transistor 312 of the reference section by the regulation effect achieved by the difference amplifier 318. The difference amplifier compares the signal at the source to the transistor 312 to the signal at the source of the transistor 316, and the difference between the two is used to control the gate of the transistor 320 to control the voltage at the source of the transistor 316, to make the voltages at the sources of the transistors 312 and 316 equal.

Hence, the terminal voltages of the CMOS transistors 312 and 316 are identical: they have a common gate connection, a common drain connection, and a difference amplifier arranged to equalise their source voltages.

As the terminal voltages of the reference CMOS transistor 312 and multiplying CMOS transistor 316 are identical, their current densities are also identical. If the reference section 302 conveys a current $I_S$, then the multiplying transistor conveys a current of $M \cdot I_S$, and the combined current gain of the multiplying current conveyor is 1+M.

The multiplying current conveyor scheme provided by the implementation of FIG. 3 provides a gain multiplying advantage over conventional current conveyors, whilst preserving the current conveyor benefits of low input impedance and high output impedance across a wide bandwidth.

By providing a current gain, the multiplying current conveyor allows the gain requirements of any preceding and following gain stages to be reduced.

By reducing the gain requirements of the preceding and following gain stages, the power requirements of these gain stages will be reduced.

By reducing the gain requirements of the preceding and following gain stages, the die area required by these gain stages will be reduced, and overall power conversion efficiency will be increased.

Figure 4:
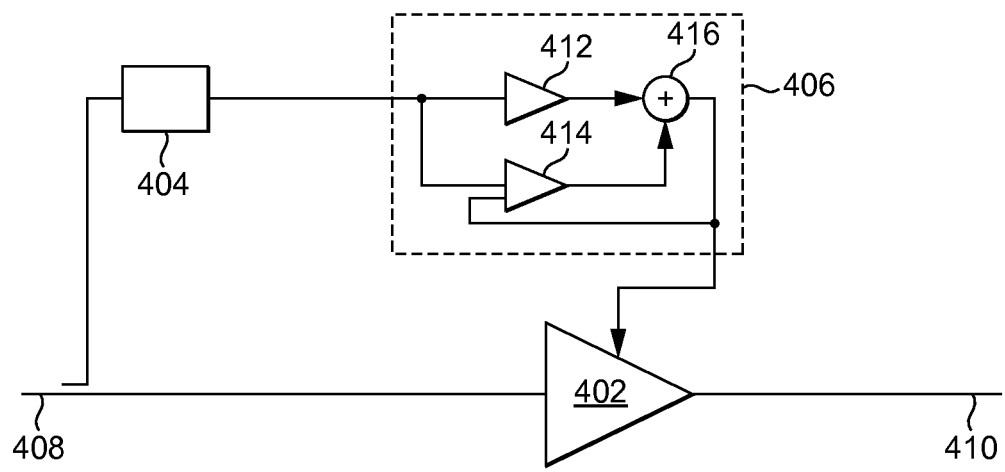
FIG. 4 illustrates an envelope tracking power amplification system including a power amplifier in which an improved current conveyor may be advantageously utilised.

With reference to FIG. 4, there is illustrated the architecture of a radio frequency (RF) envelope tracking power amplifier system including a power amplifier, which power amplifier may be adapted to include the advantageous current conveyor of FIG. 3.

As exemplified in FIG. 4, an RF input signal on line 408 provides an input to an RF amplifier 402, which provides an amplifier RF output signal on line 410. An envelope shaping stage 404 receives the input signal on line 408, and provides an envelope of the input signal to a supply modulator 406. The supply modulator includes a first path including an amplifier 412 for providing a main supply voltage. The amplifier 412 may select between switched supply levels. The supply modulator includes a second path including an error amplifier 414. The outputs of the amplifiers 412 and 414 are combined in a combiner 416. The output of the combiner 416 provides a second input to the error amplifier 414. The output of the combiner 416 forms the output of the supply modulator 406, and provides the modulated supply voltage to the amplifier 402.

The present invention has been described by way of example to its implementation in various exemplary systems. One skilled in the art will understand that the invention may be provided in systems other than those systems which are illustrated.

The invention claimed is:

1. A circuit having a first transistor being a common gate connected transistor and a second transistor, the second transistor being M times the size of the first transistor, the first and second transistors having commonly connected gates and commonly connected drains, wherein an apparatus is provided to regulate the source voltage of the second transistor to track the source voltage of the first transistor, wherein the current gain of the circuit is M+1, and wherein the drain of the first transistor provides the output of the circuit.

2. The circuit of claim 1, wherein the apparatus comprises an amplifier having input terminals coupled to the sources of the first and second transistors and configured to regulate the source voltage of the second transistor.

3. The circuit of claim wherein the output of the amplifier is coupled to the gate a third transistor, wherein the drain of the third transistor is coupled to the source of the second transistor, and wherein the output of the amplifier is configured to regulate the source voltage of the second transistor via the third transistor.

4. The circuit of claim 1 wherein the drain of the first transistor is connected to one terminal of a current source.

5. The circuit of claim 4, wherein the current source provides a biasing current for the circuit of $I_{CC}$.

6. The circuit of claim 5 wherein the current source provides a bias current of $I_{CC}*M/(1+M)$ to the second transistor.

7. The circuit of claim 5 wherein the current source provides a bias current of $I_{CC}/(1+M)$ to the first transistor.

8. A current conveyor comprising the circuit of claim 1.

9. An envelope tracking power amplifier system comprising a power amplifier, wherein the power amplifier comprises the circuit of claim 1.

10. A circuit having a first transistor being a common gate connected transistor and a second transistor, the second transistor being M times the size of the first transistor, the first and second transistors having commonly connected gates and commonly connected drains, wherein an apparatus is provided to regulate the source voltage of the second transistor to track the source voltage of the first transistor, wherein the current gain of the circuit is M+1, and wherein the source of the first transistor is connected to receive an input to the circuit.

11. The circuit of claim 10 further comprising a third transistor having a gate connected to receive the input to the circuit, and for controlling the gate of the first transistor.

12. The circuit of claim 11 wherein the drain of the third transistor is connected to the gate of the first transistor.

13. The circuit of claim 12 wherein the drain of the third transistor is connected to one terminal of a current source.

14. The circuit of claim 13 wherein the source of the third transistor is connected to electrical ground.

15. A current conveyor comprising the circuit of claim 10.

16. An envelope tracking power amplifier system comprising a power amplifier, wherein the power amplifier comprises the circuit of claim 10.

17. The circuit of claim 10, wherein the apparatus comprises an amplifier having input terminals coupled to the sources of the first and second transistors and configured to regulate the source voltage of the second transistor.

18. The circuit of claim 17, wherein the output of the amplifier is coupled to the gate of a third transistor, wherein the drain of the third transistor is coupled to the source of the second transistor, and wherein the output of the amplifier is configured to regulate the source voltage of the second transistor via the third transistor.

19. The circuit of claim 10, wherein the drain of the first transistor provides the output of the circuit.

\* \* \* \* \*